US012763290B2

(12) United States Patent
Liu et al.

(10) Patent No.: US 12,763,290 B2
(45) Date of Patent: Oct. 13, 2026

(54) IN-SITU CLOSED-LOOP MANAGEMENT OF RADIO FREQUENCY POWER GENERATOR

(71) Applicant: Taiwan Semiconductor Manufacturing Co., Ltd., Hsinchu (TW)

(72) Inventors: Wei Ting Liu, Hsinchu (TW); Wen-Wei Fan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 19/249,924

(22) Filed: Jun. 25, 2025

(65) Prior Publication Data

US 2025/0323021 A1 Oct. 16, 2025

Related U.S. Application Data

(63) Continuation of application No. 18/511,845, filed on Nov. 16, 2023, now Pat. No. 12,368,023, which is a continuation of application No. 17/461,724, filed on Aug. 30, 2021, now Pat. No. 11,854,768.

(51) Int. Cl.
*H01J 37/32* (2006.01)

(52) U.S. Cl.
CPC .. *H01J 37/32183* (2013.01); *H01J 37/32862* (2013.01); *H01J 2237/24564* (2013.01); *H01J 2237/3321* (2013.01); *H01J 2237/334* (2013.01)

(58) Field of Classification Search
CPC ........... H01J 37/32183; H01J 37/32862; H01J 2237/24564; H01J 2237/3321; H01J 2237/334
See application file for complete search history.

(56) References Cited

U.S. PATENT DOCUMENTS

2021/0407771 A1* 12/2021 Funk .................. H01J 37/3299

* cited by examiner

*Primary Examiner* — Henry Luong
(74) *Attorney, Agent, or Firm* — Seed Intellectual Property Law Group LLP

(57) ABSTRACT

The present disclosure is directed to an in situ closed-loop radio frequency (RF) power management on RF processes such as a plasma etch process, a plasma chemical vapor deposition process, a plasma physical vapor deposition process, a plasma clean process, or the like. An RF power measurement device according to one or more embodiments of the present disclosure assists the in situ closed-loop RF power management on RF processes. In some embodiments, the RF power measurement device includes a coil-shaped current sensor that is wound around the path between an RF generator and a chamber. The coil-shaped current sensor senses the current flowing through this path so that the power of the RF generator may be calibrated without having to separate the RF generator for separate analysis and calibration. The RF power measurement device allows management of RF power in an in situ closed-loop manner.

20 Claims, 5 Drawing Sheets

IN-SITU CLOSED-LOOP MANAGEMENT OF RADIO FREQUENCY POWER GENERATOR

BACKGROUND

A radio frequency (RF) power generator or power generating process is widely used as part of the semiconductor manufacturing process. For example, a RF power generating process is used in various semiconductor manufacturing processes including a plasma etch process, a plasma chemical vapor deposition (CVD) process, a plasma physical vapor deposition (PVD) process, a plasma clean process, or the like.

The RF power generator should be calibrated over time so that the power generated by the RF power generator substantially matches the original set power through the power settings. In order to calibrate the RF power generator, the pipe or connection line of the RF power generator is disconnected and reconnected to a separate power calibration loop. The process of employing the separate power calibration loop is not only time consuming but also labor intensive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
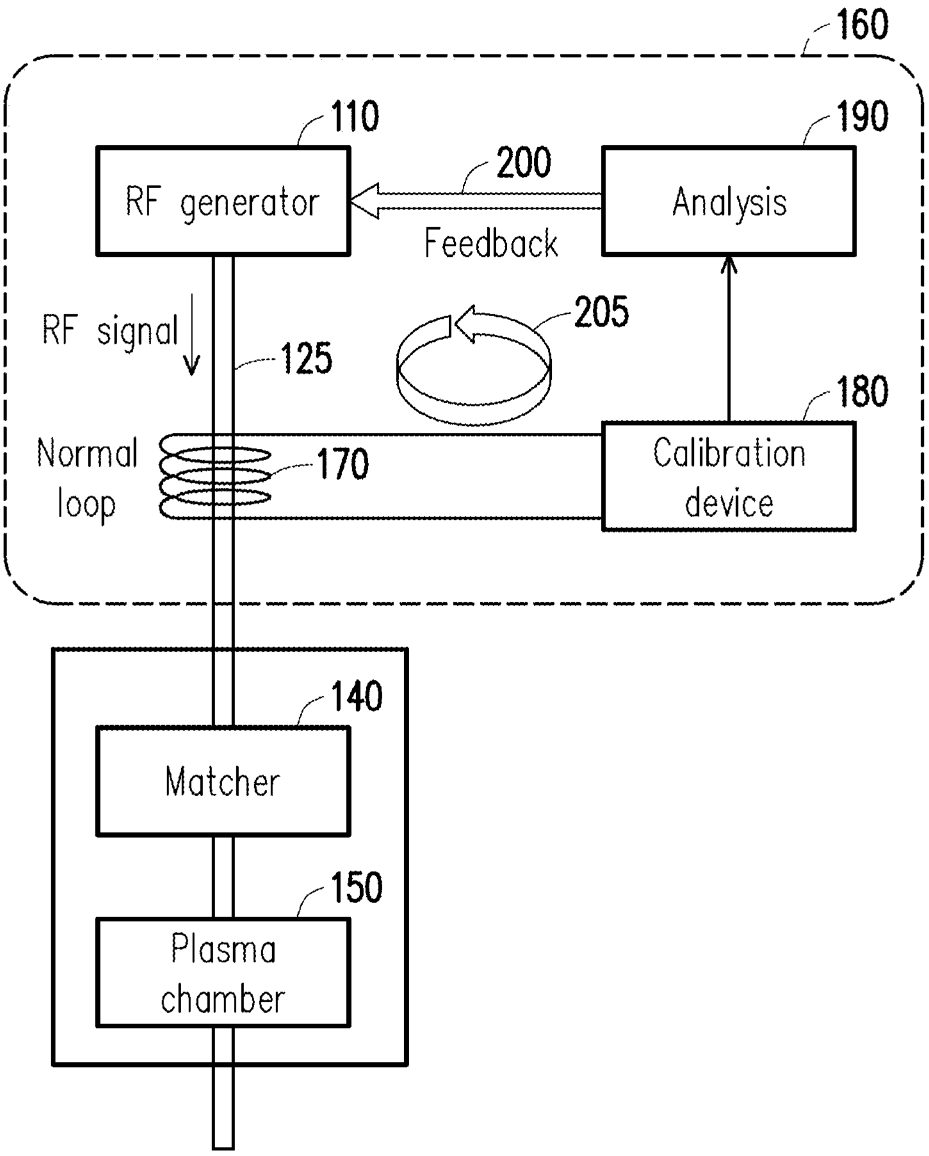
FIG. 1 is a schematic diagram of an RF power measurement device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments of the present disclosure, devices, systems, and methods are provided that improve or optimize the whole procedure of calibration of an RF generator.

FIG. 1 is a schematic diagram of an RF power measurement device in accordance with some embodiments.

An RF process is widely used in the semiconductor manufacturing process. For example, RF processes are involved in a plasma etching process, a plasma CVD process, a plasma PVD process, a plasma clean process, or the like.

As shown in FIG. 1, an RF generator 110 is configured to generate RF signals. For example, the RF generator 110 generates high voltage, high power signals (e.g., high power RF waveforms) suitable for use in any semiconductor processing tool or as part of any semiconductor manufacturing process, for example, for performing any one or more of the plasma etching process, the plasma CVD process, the plasma PVD process, or the plasma clean process. The RF generator 110 is coupled to a connection line 125 which is coupled to a matching network 140. The function of the matching network 140 will be further detailed below. The connection line 125 serves as a conduit or a channel for transferring power generated from the RF generator 110 to a process chamber 150 through the matching network 140. For example, when connected, high voltage, high power signals will be generated from the RF generator 110 and passed through the connection line 125 to the matching network 140. It is beneficial for the generated power (W: watt) of the RF generator 110 to be measured and calibrated so that a suitable range of power is provided for each plasma etching process, plasma CVD process, plasma PVD process, plasma clean process, or the like. For example, an excess power supplied by the RF generator 110 may impact the qualities of the process as well as a substrate being processed.

In some approaches, to inspect the power of the RF signal generated from the RF generator 110, a connection line between the RF generator and the process chamber are disconnected or decoupled so that a separate RF calibration loop can be connected to measure the power produced by the RF generator 110. This approach is time intensive and generally takes about 1 to 2 hours. For example, the process of decoupling the connection line 125; the process of coupling one end of the connection line 125 with the separate RF calibration loop configured to measure the power of the RF generator 110; the process of measuring, adjusting, and calibrating the power of the RF generator 110; and the process of recoupling the connection line 125 to the RF generator 110 and the matching network or the process chamber typically takes one to two hours. To elaborate, initially, the power of the RF generator 110 is turned off. Then the connection line 125 is decoupled. Next, one end of the connection line 125 is reconnected to the RF calibration loop. Then the power of the RF generator 110 is turned on and the measurements can be recorded. After all the data is manually collected, the RF generator 110 is again powered off. Once powered off, the RF calibration loop is disconnected and the connection line 125 of the RF generator 110 is reconnected to the matching network 140.

The separate RF calibration loop in the approach described above includes one or more RF sensors, a dummy load, and a meter which are used to monitor and calibrate the power of the RF generator 110. The dummy load is operatively coupled to the RF sensors. The dummy load includes a power decaying device for decaying (or reducing) the high power RF signals. The meter is operatively coupled to the RF sensors. The meter measures the power of the RF signals and outputs the power data. Because the RF calibration loop must be reconnected to monitor devices as mentioned above (e.g., one or more RF sensors, a meter, or the like) before and after calibration, this process not only increases time and cost but also increases the risk of damaging the equipment. That is, the constant connecting, disconnecting, and reconnecting process increases the possibility of causing damages to the equipment.

One or more embodiments are directed to a novel RF power measurement device 160 that obviates the need of disconnecting and connecting a connection line 125.

As shown in FIG. 1, the connection line 125 does not have to be disconnected during operation of the RF power calibration process. Accordingly, in some embodiments, the connection line 125 connecting between the RF generator 110 and the matching network 140 may be described as a single, continuous line. However, embodiments are not limited thereto, and in various embodiments the connection line 125 may include two or more lines that are separable from one another, but the lines may remain connected during operation of the RF power calibration processes described herein.

The matcher or matching network 140 includes a device for generating a matched RF signal. That is, RF signals are provided to the matching network 140 in FIG. 1 to generate a matched RF signal. The RF generator 110 may be coupled to the matching network 140, which is configured to match a source impedance of the RF generator 110 to a load impedance of the plasma chamber 150. In sum, the matching network 140 matches the source impedance of the RF generator 110 to the load impedance of the plasma chamber 150. In some embodiments, the matched RF signal compensates the mismatch in the impedance between the RF generator 110 and the process chamber 150. The matching network 140, for example, matches the source impedance to about 50 ohms.

In some embodiments, the RF generator 110 outputs the RF signal to ignite a plasma within the plasma chamber 150. The RF generator 110 outputs the RF signal as an analog RF signal to a matching network 140 and transmission line (not shown) in the matching network 140. The RF generator 110 may be coupled to the matching network 140, which is configured to match a source impedance of the RF generator 110 to a load impedance of the plasma chamber 150. In some embodiments, the source impedance is an impedance of the RF generator 110, and the load impedance is an impedance of the plasma chamber 150.

The plasma chamber 150 is coupled to the matching network 140 via a transmission line. The plasma chamber 150 may be, for example, a plasma-enhanced chemical vapor deposition chamber. The transmission line is configured to transmit a matched RF signal to the plasma chamber 150. In some examples, the transmission line is a metal plate, but the transmission line can also take the form of a coaxial cable, conductive micro-strip line, or twisted pair of copper wires, among others.

For example, there may be extra power (e.g., reflective power) generated from the RF generator 110. To elaborate, plasma is generally in an unstable status. Photons and electrons are bombarded to the wafer during the plasma process. The bombardment of the photons and electrons during the plasma process generates unwanted currents. Leaving these unwanted, additionally generated currents creates an excess power from the originally set power of the RF generator 110. Accordingly, the matching network 140 operates to remove the reflective power (in the plasma chamber 150) so that the power applied to the plasma chamber 150 is at a desired level.

The RF power measurement device 160 includes magnetic field sensor 210*a* calibration device 180, an analysis device 190, and a feedback line 200. In some embodiments, the RF power measurement device 160 may include the RF generator 110. However, in other embodiments, the RF power measurement device 160 does not include the RF generator 110 and may include magnetic field sensor 210, the calibration device 180, the analysis device 190, and the feedback line 200.

While the RF power measurement device 160 is described herein as including a magnetic field sensor 210, in various embodiments, the magnetic field sensor 210 may be any sensor suitable to sense one or more properties of an RF signal generated by the RF generator 110. The magnetic field sensor 210 is configured to measure the intensity of magnetic signals induced based on electrons, currents, or the like. For example, the magnetic field sensor 210 may be used to measure the power of the RF power signal generated by the RF generator. The RF signal generated from the RF generator 110 is of low current (e.g., electric current in ranges from picoamps to tens of thousands of amperes). More particularly, the RF signal has a relatively high voltage and high power due to the low current of the RF generator 110. Accordingly, in some embodiments, the magnetic field sensor 210 utilizes magnetic field data sensing devices to detect magnetic field generated based on the low current flowing in the connection line 125. In some embodiments, the selection of magnetic field data sensing devices or methods may depend on requirements such as magnitude, accuracy, bandwidth, robustness, cost, isolation or size. Further, the measured magnetic field value may be directly displayed by an instrument, or converted to digital form for use by a monitoring or control system.

The magnetic field sensor 210 is a device that detects magnetic field in a wire induced by a current and generates a magnetic field signal proportional to that current. In one embodiment, the magnetic field sensor 210 may include magnetic field data sensing devices that includes, but are not limited to, shunt resistor, current transformers and coils (e.g., Rogowski coils), magnetic-field based transducers and others. The generated signal could be analog voltage or current or a digital output. The generated signal can be then used to display the measured value using, for example, an oscilloscope, or can be stored for further analysis in a data acquisition system, or for other various purposes.

The magnetic field sensor 210 may have a shape or configuration suitable for detecting the low current externally (e.g., by externally coupling a coil shape portion 170 of the magnetic field sensor 210 to the connection line 125). This means that the magnetic field sensor 210 does not have to disconnect a portion of the connection line 125 in order to measure and calibrate the power of the RF generator 110.

For example, a sensitive coil device configured to detect magnetic field induced by micro-current inside the connection line 125 may be utilized as the magnetic field sensor 210. These coil-shaped portions 170 of the sensing devices 210 may be wound outside of the connection line 125 and establish an electro-magnetic connection with the connection line 125. In order to control the level of sensitivity, the coil-shaped portion 170 of the sensing devices may have windings in the hundreds or thousands. For example, a winding number of the coils may be between 100 and 2000 windings. However, various numbers of windings of the coil may be utilized based on the desired sensitivity of the device. In sum, more or fewer windings may be utilized depending on a desired sensitivity to measure the current in the connection line 125.

Additionally, the coil-shaped magnetic field sensor 210 may be arranged around the connection line 125 so that the magnetic field sensor 210 is located relatively closer to the matching network 140 (or the plasma chamber 150) than the RF generator 110. In some cases, the power of the RF signal generated by the RF generator 110 may decay as the path is extended, for example, between the RF generator 110 and the matching network 140 or the plasma chamber 150. Accordingly, it is beneficial in some embodiments that the magnetic field sensor 210 is located relatively close to the matching network 140 (e.g., closer to the matching network 140 than to the RF generator 110) to provide an accurate measurement of the RF power level in near proximity to the matching network 140 and the plasma chamber 150. In some embodiments, the magnetic field sensor 210 is located within 1 meter of a connection point between the connection line 125 and the matching network 140. In some embodiments, the magnetic field sensor 210 is located within 0.5 meter of the connection point between the connection line 125 and the matching network 140, and in some embodiments, the magnetic field sensor 210 is located within 0.1 meter of a connection point between the connection line 125 and the matching network 140.

As explained, in some embodiments, the magnetic field sensor 210 is configured to measure signals (e.g., magnetic flux) but does not directly contact the connection line 125. That is, the magnetic field sensor 210, by virtue of its coil-shaped configuration, may not be physically in contact with the connection line 125, but may nevertheless be electromagnetically coupled to the connection line 125. However, in other embodiments, the magnetic field sensor 210 may be electromagnetically coupled to the connection line 125 and physically contacting (either directly or indirectly) the connection line 125.

In further embodiments, the magnetic field sensor 210 may have any other suitable shape capable of measuring the signals without having to disconnect connection line 125. That is, FIG. 1 shows a curly coil shape but a person of ordinary skill in the art will readily understand that various other shapes may be implemented.

By analyzing the signal detected via the magnetic field sensor 210, the power of the RF signal generated by the RF generator 110 may be calculated. The RF power measurement device 160 is designed to monitor the power externally without disconnecting a portion of the connection line 125 and without connecting any calibration equipment to such a disconnected portion which can not only improve or optimize the calibration procedure but also decreases the cost of calibration. Further, with the RF power measurement device 160 according to embodiments of the present disclosure, users (e.g., engineers) may be able to increase the RF power matching rate due to the omission of the connecting and reconnecting process (e.g., because the magnetic field sensor 210 can be electromagnetically coupled to the connection line 125, the RF power for various processing tools or process chambers can be easily adjusted to match the optimal RF power for the tool or chamber). That is, the power matching rate is increased because users need not spend time connecting/reconnecting the equipment. Additionally, as will be described in further detail later herein, RF power optimization (e.g., optimizing the power generated from the RF power generator to the process chamber through an AI processing circuit shown in FIG. 3) may be achieved in some embodiments by analyzing the RF signal sensed by the magnetic field sensor 210.

The calibration device 180 is communicatively coupled to the connection line 125 and is configured to receive a sensing signal from the connection line 125. The sensing signal may be, for example, a magnetic field that is caused by the current in the connection line 125. The sensing signal may be any signal that is indicative or representative of the RF signal generated by the RF generator 110.

The analysis device 190 which is communicatively coupled to, and in some embodiments may be connected to, the calibration device 180 later provides the RF generator 110 with feedback information through a control signal provided through the feedback line 200. In some embodiments, feedback information includes a control signal that is generated by the analysis device 190 based on an analysis of the sensed current. The generated control signal includes information regarding the amount of RF power to be adjusted at the RF generator 110. The RF generator 110 analyzes the control signal and the information contained therein and outputs an adjusted RF power in accordance with the control signal at the RF generator 110. Other forms of feedback information may be included in other embodiments. As time progresses, the RF generator 110 may no longer be accurate and it may be desirable to adjust the power rate/level to ensure that a consistent RF power level is delivered, for example, to the plasma chamber 150. RF power loss is natural and depending on the settings or configuration of the RF generator or of a path through which the RF signal is delivered (e.g., through the connection line 125), there may be a 1% power loss or a 2% power loss or some other amount. For example, if a certain process is to be performed utilizing an RF signal with 200 W power and the actual power that the RF generator 110 is producing and delivering (e.g., to the matching network 140 or plasma chamber 150) is 195 W, the RF generator 110 may be calibrated through a feedback loop 205 using the calibration device 180 and the analysis device 190 to compensate for the deficient 5 W. The feedback loop 205 includes the RF generator 110, the calibration device 180, and analysis device 190. The control signal is provided from the analysis device 190 to the RF generator 110 as part of the feedback loop 205. For instance, the RF generator 110 may receive feedback through the feedback line 200 that causes the RF generator 110 to increase the power level of the generated RF signal, e.g., to generate the RF signal with 205 W so that the actual power as measured or as delivered to the matching network 140 or plasma chamber 150 may be provided at the desired power level, such as 200 W. This will be further detailed in connection with FIG. 2.

In some embodiments, the analysis device 190 receives a feedback signal from the RF generator 110. The feedback signal from the RF generator 110 may be indicative of one or more settings or parameters of the RF generator 110, such as current settings, power settings, current operational parameters of the RF generator, parameters indicative of the current state of the RF generator 110, or the like. In further embodiments, the analysis device 190 calculates an adjustment based on the sensed signal and the current or present settings of the RF generator 110 and then provides the control signal to the RF generator 110.

Figure 2:
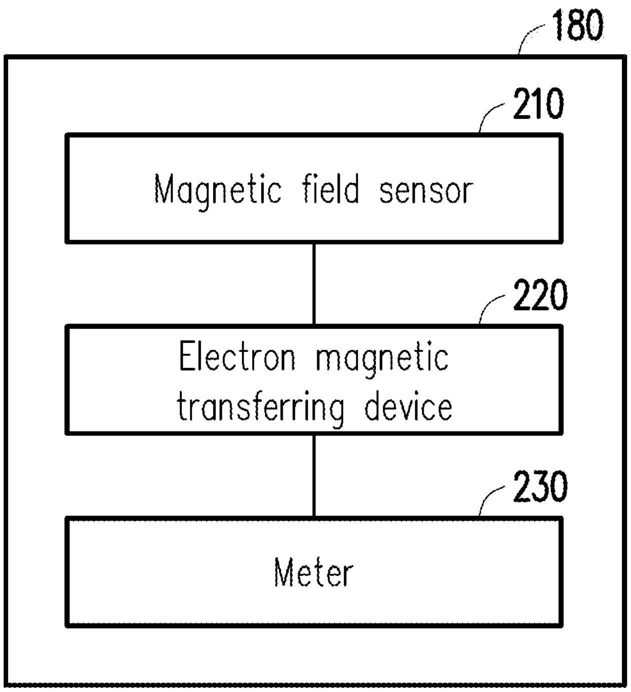
FIG. 2 is a block diagram of a calibration device in accordance with some embodiments.

FIG. 2 is a block diagram of a calibration device in accordance with some embodiments.

The calibration device 180 includes a magnetic field sensor 210, an electron magnetic transferring device 220, and a meter 230. The magnetic field sensor 210 senses the current flowing in the connection line 125 engendered by the RF generator 110. Generally, when current is generated, a magnetic field is formed adjacent to the generated current. The magnetic field sensor 210 is configured to detect magnetic field data induced by the currents (or current signals) flowing in the connection line 125 from the RF generator 110. The electron magnetic transferring device 220 turns the magnetic field data into electron signals. In some embodiments, for further analysis, the raw data of electron signals is displayed and stored by the meter 230 (e.g., oscilloscope), and such device is then able to calculate a deviation value. Before feeding back the deviation value to the RF generator 110, all of the process factors (e.g., process recipes, parts lifetime, RF hour, or the like) may be considered in an analysis device 190. First, according to the process recipes, comparison circuit 310 may revise the deviation value by analyzing the process tool types, the parts lifetime, lot by lot effect, wafer by wafer effect, or the like. As the amount of revising count accumulates, a big data base is built up to support an artificial intelligence (AI) processing circuit 320. The AI processing circuit 320 calculates the most appropriate feedback value from every process to each wafer. Eventually, the compensation circuit 330 inputs the revised deviation value to the RF generator 110 improving the following process, and the whole system carries out the calibration procedure.

The meter 230 in the calibration system is requested to display the current and voltage data relative to time factor. In detail, the meter 230 is configured to tell the user how much the level of ampere and volt are as time goes by. In some embodiments, the meter 230 includes a digital storage oscilloscope (DSO) which is generally used for various kinds of electricity. Further, in some embodiments, a customized DSO may be used.

In some embodiments, a magnetic field sensor 210, an electron magnetic transferring device 220, and a meter 230 can each be a separate device operatively working together. In other embodiments, a magnetic field sensor 210, an electron magnetic transferring device 220, and a meter 230 can be implemented as a separate circuitry that is within a same microprocessor.

Figure 3:
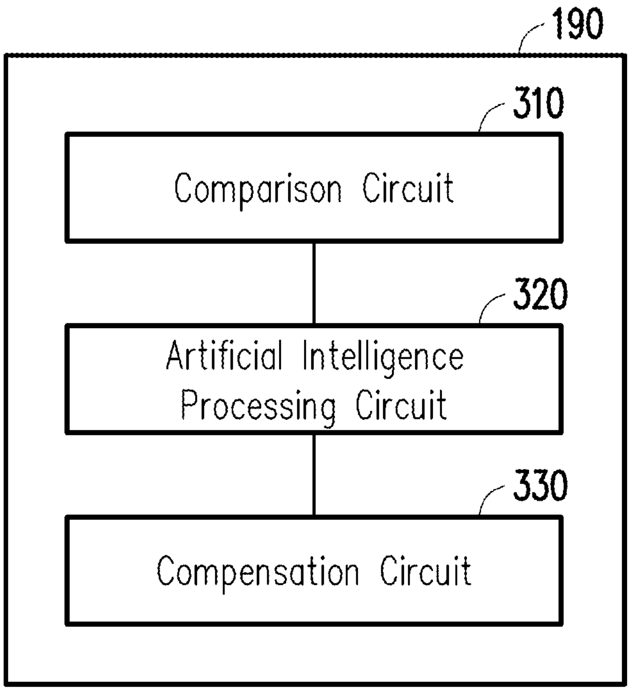
FIG. 3 is a block diagram of an analysis device in accordance with some embodiments.

FIG. 3 is a block diagram of an analysis device in accordance with some embodiments. The analysis device 190 includes a comparison circuit 310 and an artificial intelligence processing circuit 320. The analysis device 190 receives the power level of the RF generator 110 measured by the meter 230. The power level of the RF generator 110 as measured by the meter 230 may be referred to as a first power or a first power level of the RF generator 110. The comparison circuit 310 compares the measured first power (e.g., the output of the meter 230) with the originally set parameters/values of the power level of the RF generator 110. In some embodiments, a comparison circuit 310 accesses information stored in a memory (not shown) that indicates the originally set values of the RF generator 110, which may be received for example from the feedback signal from the RF generator 110. The comparison circuit 310 may also receive a reference signal indicative of the power level of the RF generator 110. The comparison circuit 310 retrieves the originally set value and then compares the signal or the value output from the meter. Alternatively, in other embodiments, the comparison circuit 310 may directly compare the reference signal (that is based on the current settings or with a target RF power to be generated or received at or near the plasma chamber 150) with the measured signal by implementing a comparator such as an OP amp.

For example, the power settings for the RF generator 110 may be set to 200 W for a certain process chamber. However, the power level as measured by the meter 230 may read 195 W. In these cases, the comparison circuit 310 compares the first power (e.g., 195 W) and the original set power (e.g., 200 W) and calculates (or otherwise generates a difference signal indicative of the difference between the reference signal and the measured signal) the difference between the first power and the original set power or otherwise generates a difference signal indicative of the difference between the first power and the original set power. Upon providing the difference signal to the AI processing circuit 320, the AI processing circuit 320 determines this amount of power to be compensated in order to calibrate the RF generator 110 so that the RF signal delivered (e.g., as measured in proximity to the matching network 140 or plasma chamber 150) has a desired power level. The AI processing circuit 320 determines the amount of power level to be compensated for the deficiency, and the control signal is provided to the RF generator 110 through the feedback line 200 that is configured to adjust RF generator 110 in order to compensate for the deficiency. For instance, in the above example, the deficiency amount is 5 W. Accordingly, because the RF generator 110 is not generating or delivering the RF signal with the power as set, this deficiency amount is determined by the AI processing circuit 320 and the deficiency information is provided to the RF generator 110. The RF generator 110 adjusts the power level of the output RF signal based on the deficiency information or control signal so that the appropriate power level is supplied to the plasma chamber 150.

In some embodiments, the RF generator 110 may receive feedback through the feedback line 200 to produce 205 W so that the actual power produced may be 200 W. In some cases, the RF generator 110 may be set to produce 205 W but may actually produce a power that is different from 205 W (e.g., because the generator itself may be degraded over time). In other cases, the RF generator 110 may be set to produce 205 W and may actually produce a power that is 205 W. However, due to the RF signal decay during transmission, the 205 W set to produce may decay to 200 W at the measurement point (e.g., near the plasma chamber 150). For either case, the RF generator 110 adjusts the power level of the output RF signal based on the control signal so that the appropriate power level is supplied to the plasma chamber 150.

The methods of calibrating the RF generator 110 based on the feedback loop 205 are not limited to the above method and other methods for compensating for the deficient power level may be contemplated. In some cases, the power level measured may be more than the initial set power value. In these cases, the similar feedback loop 205 as described above may be utilized to address the surplus of power, for example, by outputting a control signal to the RF generator 110 that causes the RF generator 110 to output the RF signal with a reduced power level.

In some embodiments, the analysis device 190 further includes a compensation circuit 330. The compensation circuit 330 is configured to automatically adjust the first power (e.g., 200 W) of the RF power generator to the second power (e.g., 205 W) so that a path (e.g., the connection line 125) between the RF generator 110 and the matching network 140 is not disconnected or interrupted during a power calibration process of the RF generator 110. That is, the compensation circuit 330 may be configured to automatically run the power feedback loop. For example, after a first cycle of the feedback loop 205, the RF generator 110 may be set to have a power value of 205 W because it was outputting 5 W less than the set power. That is, in this example, to apply the plasma process for a first substrate in the plasma chamber 150, the requested power for the plasma process is 200 W. However, in the second plasma process for applying plasma to a second substrate, the RF generator 110 may be measured to output only 197 W even though the RF generator 110 is set to output 205 W. In this case, because the RF generator 110 is outputting 8 W less, the analysis device 190 may provide through the feedback line 200 that 8 W has to be compensated and therefore the new power value of the RF generator 110 has to be set to 208 W in order to output 200 W to the plasma chamber 150 for plasma processing the second substrate. The RF generator 110 may output a different power value than a set value for the plasma treatment for a third substrate. Accordingly, the compensation circuit 330 automatically adjusts the level of power compensation needed for each process. This way, the RF generator 110 may operate as adjusted for multiple plasma processes without interruption for calibration.

Figure 4:
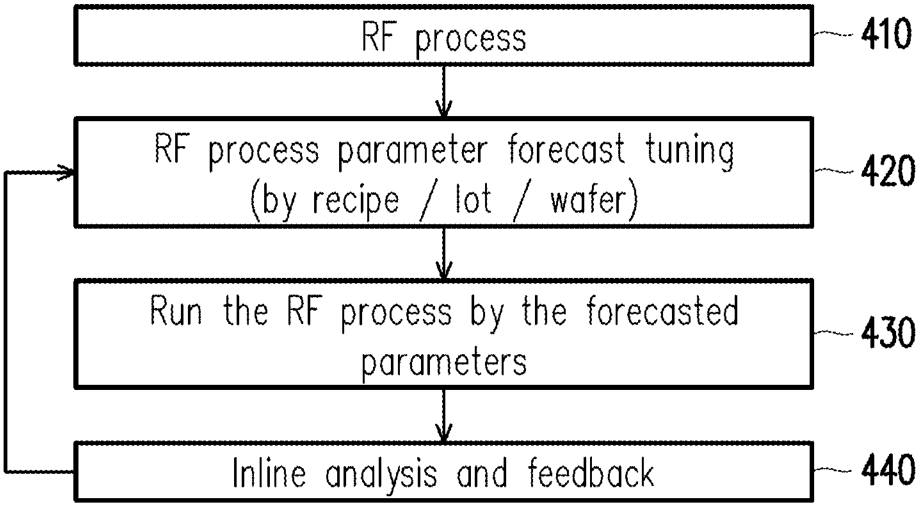
FIG. 4 is a flow chart of an analysis device analyzing the parameters in the RF process in accordance with some embodiments.

FIG. 4 is a flow chart of an analysis device analyzing the parameters in the RF process in accordance with some embodiments.

An RF power generating process may be initiated at Step 410. In some embodiments, the compensation circuit 330 of the analysis device 190 may analyze the parameters involved in the RF power generating process and take into account the parameters in order to in-situ calibrate the RF power. Some non-limiting examples of the various parameters include the duration of the RF process (e.g., RF process hours), the age or life time of the RF generator (e.g., RF generator life time), the type of tools involved in the RF process, the type of key gas used in a certain semiconductor process, various flow rates of the key gas, wafer to wafer waiting hour (e.g., the waiting time between transfer and process between wafers), the type of wafers (e.g., for different process, different types of wafers may be used), the dimension and size of wafers, the age or life time of the various parts that requires maintenance (e.g., depo-shield which is a part that insulates and protects the chamber walls, focus ring, or the like), various pattern density by recipe, recipe based process (e.g., a plasma etching process and a trench process are two different processes that require different recipe, different power, different gas, different power level generator and so forth), various pattern density by process, vacuum level, process history (including the historical measurement data obtained during the process), prelot effect, etc.

Each of these parameters of the RF power generating process may be associated or correlated with a desired RF power to be output by the RF generator 110 during processing. For example, the age or life time of the RF generator 110 may be associated with an actual output power of the RF generator 110 or a deviation (e.g., degradation) of the output RF power with respect to a current setting for the RF power, since the actual output RF power may degrade over the life time of the RF generator 110. The type of key gas and the flow rates of the key gas used in the process may be associated with the desired RF power output, as the processing of different key gases and different flow rates may be advantageously initiated by RF signals having different output power levels. The waiting time between transfer and process between wafers may be associated with a desired RF power output, as one or more conditions within the plasma chamber 150 (such as, for example, temperature) may be different depending on a time between processing of wafers within the plasma chamber 150, and thus the desired RF power output may be different depending upon the time between processing of the wafers. The type of wafers or the size and dimensions of the wafers used in a particular process may be associated with the desired RF power output, as the processing of different type of wafers with different dimensions may need different output power levels and the desired RF power may differ for each wafers.

A few examples of the parameters mentioned above are further detailed below. The analysis device 190 analyzes parameters such as RF process hour to improve the accuracy of the RF power generated.

One of the plasma etching rate (ER) is called the etching step length (ESL), which is commonly used in metal one process layers. The ESL ER trends fast as the RF process hour increases over time. However, its growing rate is highly relative to numerous tool parts, such as focus ring, deposition shield, coating wall, inner cell, cooling plate, or the like. Such feature makes growing rate distinctive from tool to tool, and it is difficult to predict manually and calculate manually. In some approaches, ER tests are executed once every certain period to monitor the ESL ER. Further, the ER tests are executed in each and every tool. The ESL ER monitored is then collected and the RF process power generated by RF generator 110 can be adjusted to decrease when ER increases beyond an acceptable threshold. Some of the RF process cycle may extend up to about 800~900 hours. Accordingly, the adjustment of the RF process power manually is a labor-intensive and time-consuming routine job.

The AI processing circuit 320 according to some embodiments analyzes and calculates all the ER relative factors (e.g., tool parts, RF process hours, historical ER monitor results database, or the like) so that the ER could be automatically tuned. Such operation of the AI processing circuit 320 of the analysis device 190 may save time but also improve the ER accuracy.

Another example of the parameters that the analysis device 190 analyzes includes RF generator lifetime. RF generators are multi-functional power supplies. As all electricity, the power supply decays over time. While generators have a relative long lifetime (for example, over 5 years), which means its power supply decays relatively slow, the ERs are sensitive to power output and accordingly the detected power decay induces large impact in plasma etching. For example, the power output performance may be only about 90% for a 5-year-used generator. To satisfy a 100 W output demand, the engineers could enter a 111 W input for such generator (since the generator has only 90% performance, 111 W input turns to 99.9 w output, and the power demand is achieved with only 0.1% err (tuning err)). However, this too is another time-consuming and labor-intensive work.

The AI processing circuit 320 according to some embodiments can calculate how much the power difference is between input and output in all the generators, and the RF power measurement system can revise input value to carry out precise power demand.

Another parameter includes low pressure gas flow and high voltage power. These two parameters are relevant in inducing plasma. Generally, the volume of plasma becomes larger with a greater gas flow. When the gas flow becomes greater, a higher power input is needed to create plasma (that is, to turn gas molecule into excited proton and electron). In some cases, the gas flow demand may be close to the maximum or minimum gas flow meter that the control ability of the gas flow meter may not be accurate. The AI processing circuit 320 according to some embodiments could also amend the power output when the key gas flow is not accurate.

Another example parameter the analysis device 190 takes into account is the wait time between processing wafers. When the RF etching procedure is executed in one piece of wafer at a time, there are generally some different conditions between each of them. For example, for the very first wafer that is being processed, the RF plasma etching tool may have been idle for some period of time. This means that the plasma had not existed in the RF plasma etching tool for that period of time. For instance, the temperature in the plasma chamber is likely to be lower than the subsequently inputted wafers as the plasma etching for the first wafer is conducted in a lower temperature condition. Accordingly, wafer to wafer waiting hour may also impact the quality of the plasma etching. The AI processing circuit 320 according to some embodiments may also monitor wafer to wafer waiting time to minimize or reduce any differences in each wafer by calibrating the generator output.

As described, many different parameters may be considered for each unique process and each of the parameters may be related to an appropriate or desired power level of the RF signal to be generated for each such unique process. The AI processing circuit 320 takes these parameters into account, for example by training of the AI processing circuit based at least in part on these parameters, and predicts the compensation level of the power for the RF power generator at Step 420.

In order to repeatedly train the AI processing circuit 320, the RF process may be run based on the identified parameters at Step 420. The RF process is run based on the forecasted parameters at Step 430 and this result is compared with the actual measured data.

At Step 440, based on the differences between the forecasted/predicted data and the actual measured data, the analysis results are output and the analyzed data are fed back to Step 420 so that the parameters can be further adjusted. This process of Step 420, Step 430, Step 440, Step 420, Step 430, Step 440 and so forth may continue until the predicted data based on the AI processing circuit 320 substantially reduces the error (e.g., difference between target RF power and set RF power) to within an acceptable range as may be determined, for example, based on a desired accuracy of the power level delivered by the RF generator 110.

An example can be made with respect to the parameter associated with the pre-lot effect. For instance, a plasma chamber can generally only bombard one wafer at a time. That is, a wafer (e.g., a first wafer) is transferred into the plasma chamber and within the plasma chamber, the first wafer is bombarded with plasma gas for a selected time (e.g., about 2-10 minutes). Then the first wafer is removed from the plasma chamber and is transferred for subsequent processing. After the processing of the first wafer in the plasma chamber, the temperature of the plasma chamber may not be identical to the initial temperature in which the previous wafer (i.e., the first wafer) was processed with plasma gas. For instance, a subsequent wafer (e.g., a second wafer) transferred into the plasma chamber may have a higher initial temperature than the initial temperature of the previous wafer (i.e., the first wafer). And this trend may continue for subsequently supplied wafers to the plasma chamber. This is the pre-lot effect explained in terms of temperature.

The pre-lot effect may be explained in terms of pressure as well. Initially, the chamber will be set to be in a low pressure status for a first wafer that is being processed in a high power plasma chamber. A second wafer may then be transferred into the plasma chamber. The initial pressure for the second wafer, however, may be a pressure lower than the initial pressure of the first wafer when the first wafer was placed into the plasma chamber. And this trend may continue for subsequently supplied wafers to the plasma chamber. For example, a third wafer transferred into the plasma chamber will have a lower initial pressure than that of the second wafer.

The AI processing circuit 320 may take into account both the temperature and the pressure caused by the pre-lot effect, based on training of the AI processing circuit 320 with data indicative of desired RF power or optimal RF power at a variety of different temperatures and pressures within the chambers (e.g., plasma chamber). The AI processing circuit 320 can predict the effect of the pre-lot effect in the plasma chambers after collecting data for multiple cycles and applying this result to the RF power generating process. Accordingly, in some embodiments, the generated amount of RF power may be adjusted to consider the pre-lot effect as well as other parameters listed above to provide an accurate feedback result to the RF power generator 110.

In some embodiments, the AI processing circuit 320 may give weight to each of the parameters. However, in other embodiments, the compensation circuit 330 may give weight to each of the parameters. For example, in some processes, power may be a key parameter. In such processes, the AI processing circuit 320 can give the power parameter a greater weight than, for example, temperature. On the other hand, if power is not a key parameter in the process, for example the process shown in FIG. 5, than other parameters may be given greater weight.

In some embodiments, the RF power measurement device is driven with AI algorithms and technology, and therefore includes the AI processing circuit 320. The AI processing circuit 320 may include an AI training module capable of training the system to employ one or more artificial intelligence techniques. "Artificial intelligence" is used herein to broadly describe any computationally intelligent systems and methods that can learn knowledge (e.g., based on training data and further based on actual measured data), and use such learned knowledge to adapt their approaches for solving one or more problems, for example, by making inferences based on a received input such as measurements (measurement data) received via the RF power measurement device 160. Artificially intelligent machines may employ, for example, neural network, deep learning, convolutional neural network, Bayesian program learning, and pattern recognition techniques to solve problems such as determining the conditional requirements within the RF power feedback look of the RF power measurement device 160 and dynamically address the conditions/parameters (e.g., the duration of the RF process, the age or life time of the RF generator, the type of tools involved in the RF process, the type of key gas used in a certain semiconductor process, various flow rates of the key gas, wafer to wafer waiting hour, the type of wafers, the dimension and size of wafers, the age or life time of the various parts that require maintenance, various pattern density by recipe, recipe based process, various pattern density by process, vacuum level, process history, pre-lot effect, gas concentration in chambers, gas flow rate, pressure level, temperature, humidity level, or the like) in the RF power measurement device 160 using AI technology.

Further, artificial intelligence may include any one or combination of the following computational techniques: constraint program, fuzzy logic, classification, conventional artificial intelligence, symbolic manipulation, fuzzy set theory, evolutionary computation, cybernetics, data mining, approximate reasoning, derivative-free optimization, decision trees, and/or soft computing. Employing one or more computationally intelligent techniques, the AI processing circuit 320 may learn to automatically determine and apply the parameters and appropriately provide feedback and output power to the RF power measurement device 160.

Various training inputs may further be provided to the AI processing circuit 320 for training purposes. The training input may include, for example, at least the above listed parameters and other various historical data measured during the RF power generating process. For example, the training data may include the historical data drawn from previous RF processes and the training data may represent different RF powers based on different parameters (including, but not limited to the duration of the RF process, the age or life time of the RF generator, the type of tools involved in the RF process, the type of key gas used in a certain semiconductor process, various flow rates of the key gas, wafer to wafer waiting hour, the type of wafers, the dimension and size of wafers, the age or life time of the various parts that requires maintenance, various pattern density by recipe, recipe based process, various pattern density by process, vacuum level, historical RF process measurement data, pre-lot effect, etc.). These training data may be inputted to the AI processing circuit 320 manually initially, but after some training process, the AI processing circuit 320 will further learn and improve based on the actual measured data collected while the RF power measurement device 160 operates.

In some embodiments, using training data, the AI processing circuit 320 may implement an iterative training process. Training may be based on a wide variety of learning rules or training algorithms. For example, the learning rules may include one or more of the following: back-propagation, real-time recurrent learning, pattern-by-pattern learning, supervised learning, unsupervised learning, semi-supervised learning, reinforcement learning, self-learning, feature learning, sparse dictionary learning, anomaly detection, interpolation, weighted sum, reinforced learning, temporal difference learning, and/or recording learning.

One exemplary training algorithm that can be used in the AI processing circuit 320 is the back-propagation learning algorithm which is a common method of training artificial neural networks. Back-propagation generally includes two phases: propagation and weight update. In the propagation phase, a training pattern's input is forward propagated through a neural network in order to generate the propagation's output activations. Then, the propagation's output activations are backward propagated through the neural network using the training pattern target in order to generate deltas (i.e., the difference between the input and output values) of all output and hidden neurons. In the weight update phase, for each weight-synapse the following steps are generally performed: the first step, multiply its output delta and input activation to get the gradient of the weight; the second step, subtract a ratio (percentage) of the gradient from the weight. The propagation and weight update phases are repeated as desired until performance of the network is satisfactory.

Figure 5:
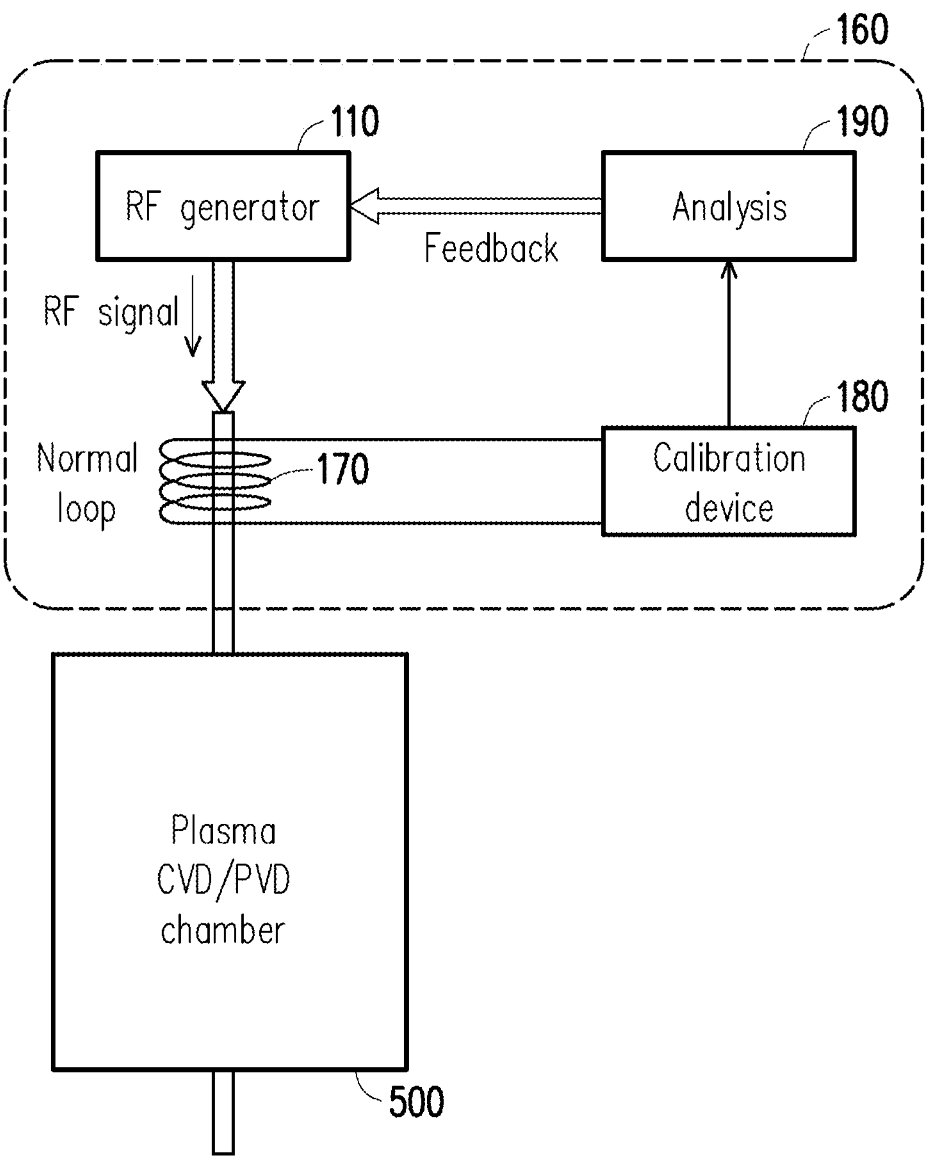
FIG. 5 is a schematic diagram of the RF power generating device applied to either a plasma chemical vapor deposition process or a plasma physical vapor deposition process in accordance with some embodiments.

FIG. 5 illustrates the RF power generating system being applied to either a plasma chemical vapor deposition process or a plasma physical vapor deposition process, in accordance with some embodiments.

As shown in FIG. 5, the RF power measurement device 160 can be operatively coupled to the plasma CVD chamber 500 or the plasma PVD chamber 500. Here, the distinction between the plasma CVD chamber 500 and the plasma PVD chamber 500 is minimal as both chambers do not require a matching network (see FIG. 1 as a comparative example that does utilize a matching network). For these processes, supplying plasma in a stable manner and for an elongated period of time may be the key parameters for these processes. For example, for the plasma to be used in the plasma CVD chamber 500 or the plasma PVD chamber 500, the plasma has to be stably supplied for about 5-10 minutes in the plasma chamber. Here, instead of a specific power generator 110, having a power generator that can stably supply plasma for a relatively long term is key to the CVD, PVD process. That is, in the CVD, PVD process, having a stable pressure source is relatively more important than a specific power source that can provide a stable power. In this example, pressure is a key parameter compared to power. For this reason, a matching network 140 that was shown in FIG. 1 is not required for the embodiments related to the plasma CVD chamber and the plasma PVD chamber 500.

The components of the RF power measurement device 160 in FIG. 5 may be identical or substantially identical to that shown in FIG. 1. That is, the magnetic field sensor 210, the calibration device 180, the analysis device 190, and the feedback line 200 shown in FIG. 1 and FIG. 5 may be substantially similar to each other.

Figure 6:
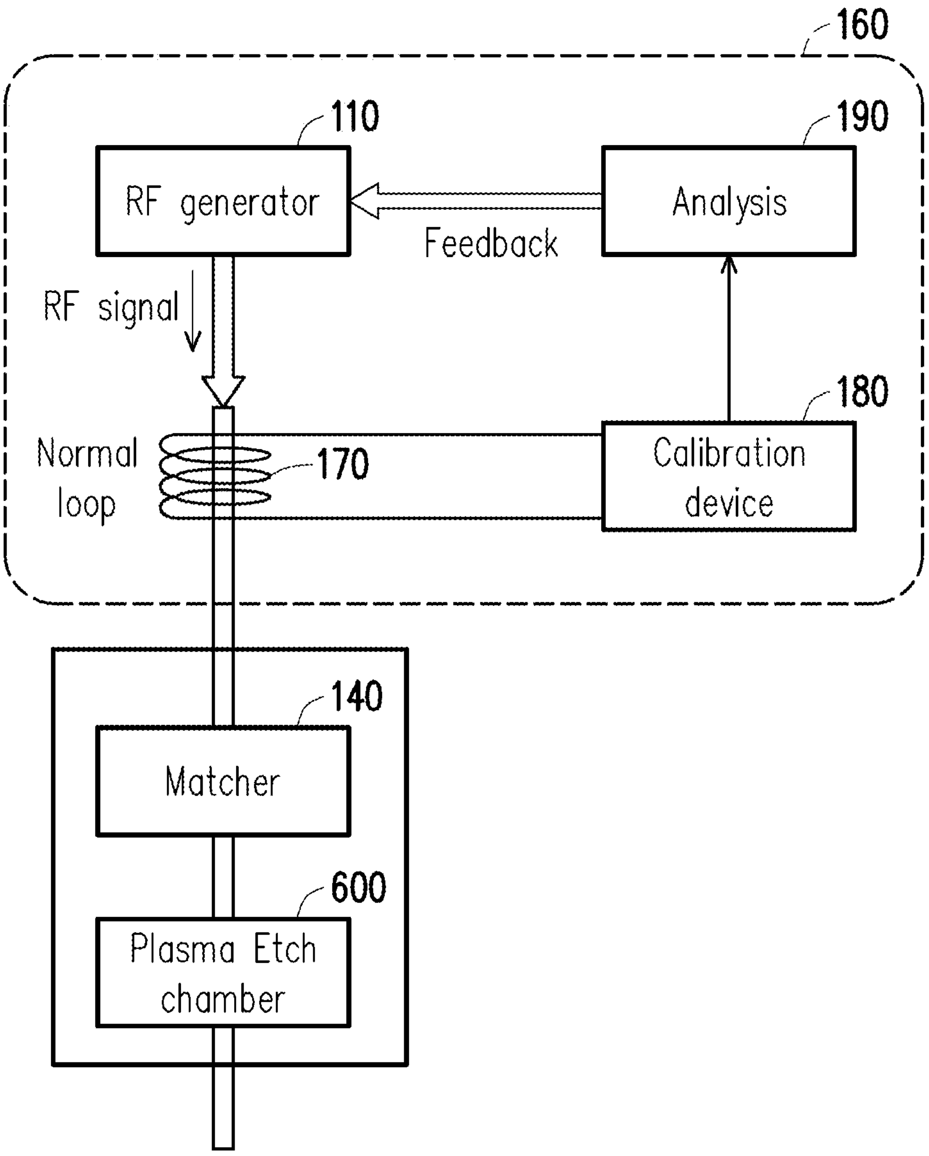
FIG. 6 is a schematic diagram of the RF power generating device applied to a plasma etching process in accordance with some embodiments.

FIG. 6 shows an embodiment where power is a key parameter. FIG. 6 illustrates the RF power generating system being applied to a plasma etching process, in accordance with some embodiments.

Power is a key parameter in the plasma etching process. Accordingly, a matching network 140 is operatively coupled between the plasma etching chamber 600 and the RF power measurement device 160. In some plasma etching processes, it may be beneficial to have several RF power generators for one process. In this example, a first power generator producing 200 W may be applied for about 10 seconds, a second power generator producing 500 W may be applied for about 20 seconds, and a third power generator producing 100 W may be applied for about 30 seconds.

As explained in connection with FIG. 5, the CVD and PVD process uses a single stable plasma power source that can be applied for a long time, thus power becomes a less important parameter for these two processes. Unlike the CVD and PVD process of FIG. 5, it may be beneficial for the plasma etching process to have several different RF power generators having different power output. It further may involve different RF power generators being applied for a different period of time. Accordingly, a matching network 140 is beneficial in this embodiment to remove any reflective power generated based on the excess current produced by the bombardment of the photons and electrons during the plasma process.

The AI processing circuit 320 may consider all the parameters involved and in accordance with the process flow described in FIG. 4, the AI processing circuit 320 may output automatically calibrated power output to the RF generator 110. The power calibration process becomes less time consuming as the RF calibration loop is externally installed around the connection line (e.g., RF pipeline) that connects the RF generator 110 to the chamber. Further, the RF power measurement device according to the present disclosure provides other benefits such as facilitated semiconductor process and reduced cost by obviating the need for a separate RF calibration process that involves the disconnection and reconnection of the RF pipelines.

Embodiments of the present disclosure provide several advantages. For example, in some embodiments, the RF power measurement device can be operatively connected to the connection line (e.g., pipeline) between the RF generator and a process chamber without disconnecting the connection line. The RF power measurement device measures in-situ the RF power produced by the RF generator and calibrates the RF power so that a desired RF power is supplied to the process chamber. In some approaches, in order to calibrate the RF power, a separate calibration device had to be physically connected to the connection line. The physical connection involves disconnecting a portion of the connection line and connecting the pipelines of the separate calibration device. Once the separate calibration device is connected, the RF power measurement and the calibration process is conducted. Once this is completed, the separate calibration device is disconnected from the portion of the connection line. According to one or more embodiments of the present disclosure, the RF power measurement device performs the RF power measurement and the calibration process but without having to disconnect the portion of the connection line. Instead, the RF power measurement device establishes a non-contact external connection with the connection line between the RF generator and the process chamber. This obviates the need of a separate RF power calibration device having to disconnect and connect each time to the connection line when a RF power measurement and calibration is needed. Reducing or eliminating the use of a separate calibration device requiring physical connection with the connection line results in increased production yields, quality, reliability, and profitability, since the time can be reduced for connection process of the separate calibration device. This novel approach not only reduces time but also reduces cost by reducing the risk of damaging the equipment. That is, the constant connecting, disconnecting, and reconnecting process increases the possibility of causing damages to the associated equipment.

In one or more embodiments, a radio frequency (RF) power measurement device is provided. The RF power measurement device includes a current sensor, a calibration device, and an analysis device. The current sensor is configured to be electromagnetically coupled to a path between a RF power generator and a process chamber. The current sensor is configured to generate a sensing signal indicative of an RF signal in the path. The calibration device is coupled to the current sensor. The calibration device is configured to receive the sensing signal and determine a first power of the RF signal based on the sensing signal. The analysis device is coupled to the calibration device. The analysis device is configured to adjust the first power of the RF power generator to a second power via a control signal. The control signal is generated based on the determined first power which is configured to cause the RF power generator to the second power.

Further aspects of the present disclosure include a method of measuring RF power. The method includes electromagnetically coupling a current sensor to a path between a RF power generator and a process chamber. The method includes generating a sensing signal indicative of an RF signal in the path. The method includes receiving the sensing signal at a calibration device. The method includes determining, by the calibration device, a first power of the RF signal based on the sensing signal. The method includes generating a control signal based on the determined first power. The method includes adjusting the first power of the RF generator to a second power based on the control signal.

Yet further aspects of the present disclosure include a RF power measurement system. The RF power measurement system includes a process chamber, a RF power generator configured to supply RF power to the process chamber, and a connection line coupled between the process chamber and the RF power generator. The connection line is configured to provide a path for RF signals from the RF power generator to the process chamber. The RF power measurement system includes a current sensor configured to be electromagnetically coupled to the connection line. The current sensor configured to generate a sensing signal indicative of the RF signals in the path. The RF power measurement system includes a calibration device coupled to the current sensor. The calibration device is configured to receive the sensing signal, and determine a first power of the RF signals based on the sensing signal. The RF power measurement system includes an analysis device coupled to the calibration device. The analysis device is configured to adjust the first power of the RF power generator to a second power via a control signal. The control signal is generated based on the determined first power and is configured to cause the RF power generator to output the RF signals at the second power.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A radio frequency (RF) power measurement device, comprising:

a current sensor coupled to a path between a RF power generator and a process chamber, the current sensor configured to generate a sensing signal indicative of an RF signal in the path;

a calibration device coupled to the current sensor, the calibration device including a magnetic field sensor, an electron magnetic transferring device, and a meter, wherein the magnetic field sensor of the calibration device is configured to determine a magnetic data based on a magnetic field generated based on the RF signal flowing in the path;

wherein the electron magnetic transferring device of the calibration device is configured to determine a power level of the RF signal including electrons based on the magnetic data; and wherein the meter of the calibration device is configured to determine a first power of the RF generator based on the power level of the RF signal.

2. The RF power measurement device according to claim 1, further comprising:

an analysis device coupled to the calibration device, the analysis device configured to adjust the first power of the RF power generator to a second power via a control signal, wherein the control signal is generated based on the determined first power, wherein the control signal is configured to cause the RF power generator to adjust the first power to the second power, and wherein the first power and the second power is different from each other.

3. The RF power measurement device according to claim 1, wherein the current sensor includes a coil-shaped current sensor externally wound around the path.

4. The RF power measurement device according to claim 3, wherein the coil-shaped current sensor includes a plurality of wounded coils, wherein the plurality of wounded coils arranged around the path at a location that is closer to the process chamber than the RF generator.

5. The RF power measurement device according to claim 1, wherein the current sensor is physically spaced apart from the path.

6. The RF power measurement device according to claim 1, wherein the current sensor at least partially contacts the path.

7. The RF power measurement device according to claim 2, wherein the analysis device is further configured to automatically adjust the first power of the RF power generator to the second power so that the path between the RF generator and the process chamber is not disconnected during a power calibration process of the RF generator.

8. The RF power measurement device according to claim 2, wherein the RF generator generates a feedback signal to the analysis device, via a feedback loop, the feedback signal providing current operational settings or parameters of the RF generator to the analysis device, and wherein the analysis device generates the control signal based on the feedback signal.

9. A radio frequency (RF) power measurement system, comprising:

a process chamber;

a RF power generator configured to supply RF power to the process chamber;

a connection line coupled between the process chamber and the RF power generator, wherein the connection line is configured to provide a path for RF signals from the RF power generator to the process chamber;

a current sensor configured to be electromagnetically coupled to the path between the RF power generator and the process chamber, the current sensor configured to generate a sensing signal indicative of the RF signals in the path;

a calibration device coupled to the current sensor, the calibration device including a magnetic field sensor and an electron magnetic transferring device, wherein the magnetic field sensor of the calibration device is configured to determine a magnetic data based on a magnetic field generated based on the RF signal flowing in the path; and wherein the electron magnetic transferring device of the calibration device is configured to determine a power level of the RF signal including electrons based on the magnetic data.

10. The RF power measurement system according to claim 9, wherein the calibration device further includes a meter, wherein the meter of the calibration device is configured to determine a first power of the RF generator based on the power level of the RF signal, and wherein the RF power measurement system further comprises:

an analysis device coupled to the calibration device, the analysis device configured to adjust the first power of the RF power generator to a second power via a control signal, wherein the control signal is generated based on the determined first power, and wherein the control signal is configured to cause the RF power generator to adjust the first power to the second power.

11. The RF power measurement system according to claim 10, wherein the analysis device is further configured to automatically adjust the first power of the RF power generator to the second power without disconnecting the path between the RF power generator and the process chamber during a power calibration process of the RF power generator.

12. The RF power measurement system according to claim 10, wherein the RF generator is operatively coupled to the analysis device, and wherein the RF generator generates a feedback signal to the analysis device, via a feedback loop, the feedback signal providing current operational settings or parameters of the RF generator to the analysis device, and wherein the analysis device generates the control signal based on the feedback signal.

13. The RF power measurement system according to claim 12, wherein the feedback loop is a closed loop including the RF generator, the calibration device, and the analysis device.

14. The RF power measurement system according to claim 9, wherein the current sensor includes a coil-shaped current sensor externally wound around the path.

15. The RF power measurement system according to claim 14, wherein the coil-shaped current sensor includes a plurality of wounded coils, wherein the plurality of wounded coils is arranged around the path at a location that is closer to the process chamber than the RF power generator.

16. The RF power measurement system according to claim 9, further comprising a power matching device between the process chamber and the RF generator, wherein one end of the path is operatively connected to the power matching device, the power matching device configured to remove additional generated power to provide the process chamber with the second power.

17. A method of measuring radio frequency (RF) power, comprising:

generating, by a current sensor positioned at a path between a RF power generator and a process chamber, sensing signals indicative of RF signals in the path;

receiving the sensing signals at a magnetic field sensor coupled to the current sensor;

determining, by the magnetic field sensor, a magnetic data based on a magnetic field generated based on the RF signals flowing in the path;

determining a power level of the RF signals including electrons based on the magnetic data and the first power of the RF power generator based on the power level of the RF signals; and adjusting the first power of the RF generator to a second power based on control signals based on the determined first power.

18. The method of measuring RF power of claim 17, comprising:

adjusting the first power of the RF power generator to the second power while maintaining connection of the path between the RF power generator and the process chamber during a power calibration process of the RF power generator.

19. The method of measuring RF power of claim 17, comprising:

automatically adjusting the first power of the RF power generator to the second power so that the path between the RF power generator and the process chamber is not disconnected during a power calibration process of the RF power generator.

20. The method of measuring RF power of claim 17, comprising:

generating a feedback signal via a feedback loop, the feedback signal including current operational settings or parameters of the RF generator, wherein the feedback loop is a closed loop including the RF generator, the magnetic field sensor, the electron magnetic transferring device, and the meter, and wherein the control signals are based on the feedback signal.

* * * * *